US005635828A

United States Patent [19]
Yoshizawa et al.

[11] Patent Number: 5,635,828
[45] Date of Patent: Jun. 3, 1997

[54] ACTIVE FILTER CIRCUIT AND POWER SUPPLY APPARATUS INCLUDING SAME

[75] Inventors: Yoshihito Yoshizawa, Fukaya; Tooru Abe, Kumagaya; Shin Nakajima, Kumagaya; Shunsuke Arakawa, Kumagaya, all of Japan

[73] Assignee: Hitachi Metals, Ltd., Tokyo, Japan

[21] Appl. No.: 347,129

[22] Filed: Nov. 23, 1994

[30] Foreign Application Priority Data

Nov. 26, 1993 [JP] Japan .................................. 5-296950

[51] Int. Cl.$^6$ .................................................. H01F 27/24
[52] U.S. Cl. .................................... 323/362; 363/89
[58] Field of Search .................................. 323/362, 363, 323/222; 363/89, 21

[56] References Cited

U.S. PATENT DOCUMENTS

| | | | |
|---|---|---|---|
| 4,871,925 | 10/1989 | Yamauchi et al. | 307/106 |
| 4,881,989 | 11/1989 | Yoshizawa et al. | 148/302 |
| 4,896,091 | 1/1990 | Kislovski | 323/253 |
| 4,985,089 | 1/1991 | Yoshizawa et al. | 148/303 |
| 5,430,364 | 7/1995 | Gibson | 323/207 |

FOREIGN PATENT DOCUMENTS

| | | |
|---|---|---|
| 3435519 | 4/1985 | Germany . |
| 3835986 | 3/1989 | Germany . |
| 4230986 | 3/1993 | Germany . |
| 1-169905 | 7/1989 | Japan . |
| 1-242755 | 9/1989 | Japan . |

OTHER PUBLICATIONS

Patent Abstracts of Japan, vol. 17, No. 22 (E-1307), 14 Jan. 1993 & JPA 04 249 303 (Takeshi Masumoto), Sep. 4, 1992.

*Primary Examiner*—Peter S. Wong
*Assistant Examiner*—Rajnikant B. Patel
*Attorney, Agent, or Firm*—Sughrue, Mion, Zinn, Macpeak & Seas

[57] ABSTRACT

An active filter circuit including a smoothing filter including a choke coil comprising a magnetic core composed of a nanocrystalline alloy and having a magnetic gap in at least one portion thereof and at least one conductive wire wound around the magnetic core, the nanocrystalline alloy having a composition of 0.1–3 atomic % of at least one element selected from the group consisting of Cu and Au, 1–7 atomic % of at least one element selected from the group consisting of Ti, Zr, Hf, V, Nb, Ta, Mo and W, 10–17 atomic % of Si, and 4–10 atomic % of B, the balance being substantially Fe and inevitable impurities.

13 Claims, 5 Drawing Sheets $V_{in}$ $V_{out}$ $I_{in}$

ACTIVE FILTER CIRCUIT AND POWER SUPPLY APPARATUS INCLUDING SAME

BACKGROUND OF THE INVENTION

The present invention relates to an active filter circuit disposed on the input side of a power supply for improving power factor, and a power supply apparatus with a high power factor including such an active filter circuit.

Most of switching power supplies to which commercial electricity is applied, such as inverters, converters, choppers, etc. include rectifying circuits of a capacitor input-type. A typical example of such rectifying circuits is shown in FIG. 3.

AC current supplied from an AC power supply A is rectified by a diode bridge B, and smoothed by a capacitor C. The wave forms of voltage and current in each part of the circuit in FIG. 3 are shown in FIGS. 4 (a)–(c). When input voltage $V_{in}$ having a wave form shown in FIG. 4 (a) is supplied from the AC power supply A, the output voltage $V_{out}$ of the capacitor C has a wave form shown by the solid line in FIG. 4 (b). Here, the dotted line in FIG. 4 (b) shows a wave form of voltage applied to a load Lo when there is no capacitor C. As shown in FIG. 4 (c), input current $I_{in}$ in flows only when the solid line and the dotted line are superimposed in FIG. 4 (b).

However, in such a circuit, since the input current flows only when the voltage is near its peak as shown in FIGS. 4 (b) and (c), the peak value of the current is inevitably high. If the current including a lot of such higher harmonics flows through a line, the voltage wave form of the AC line is distorted, and the higher harmonics enter into other equipment, resulting in the malfunction of electric devices, etc. and a decrease in the power factor of the AC power supply A.

Various proposals have been made hitherto to solve such problems. There is a system comprising a resistor disposed in an input line. However, this system is disadvantageous in efficiency, improvement of a wave form, variation of rectified voltage due to load current, etc. There is also a simple system comprising an inductor in an input line, which is suitable for small-output power supply. Nevertheless, this inductor-including system is disadvantageous because of a large size of the inductor used, insufficient improvement of a wave form, large variation of rectified voltage due to load current, etc. There is further a system comprising an active filter circuit in an input line, which is most effective and widely used for suppressing higher harmonics. However, this active filter circuit is generally disadvantageous because of an increase in the number of parts used and a high cost.

There is for instance an active filter circuit comprising a transistor constituting a by-pass for current which flows into a capacitor. The rapid switching of the transistor makes an average input current have a nearly sinusoidal wave form. FIG. 5 shows one example of a boosting chopper-type active filter circuit.

This active filter circuit comprises an AC power supply 51, a diode bridge 52, an inductor 53, a diode 54, a resistor 55, a transistor 56 connected between the inductor 53 and the resistor 55, and a capacitor 57 connected between the diode 54 and the resistor 55. Connected in parallel with the capacitor 57 is a load 60. The active filter circuit further comprises a controller 61 connected to the output terminal of the diode 52, the resistor 55, a gate of the transistor 56 and the output terminal of the diode 54. In such an active filter circuit, the high-frequency switching by the transistor 56 makes it possible to reduce the levels of an inductance L and an capacitance C necessary for the active filter. Thus, the choke coil used as inductance L in this circuit can be miniaturized as the switching of the transistor becomes faster.

Used as a choke coil for the active filter circuit may be a ferrite magnetic core with a gap, a silicon-steel magnetic core with a gap, a magnetic core made of an amorphous Fe-base alloy with a gap, a magnetic core made of an amorphous Fe-base alloy or an Fe—Al—Si alloy powder without a gap, etc. However, the ferrite magnetic core of the choke coil for an active filter circuit is likely to be easily saturated, and to exhibit sufficient effects, it is necessary to expand the gap, to increase the number of turns of a coil or to enlarge the size of the magnetic core. The increase in the number of turns of a coil leads to an increase in copper loss and heat generation of the coil, resulting in drastic temperature elevation. On the other hand, if the choke coil is enlarged, the overall circuit cannot be miniaturized.

Since the choke coil using a silicon-steel magnetic core suffers from a large core loss at a high frequency, the high-frequency switching for miniaturizing a choke coil and other parts results in a drastic temperature elevation, meaning that a switching frequency cannot be increased so much. In the case of the choke coil using a magnetic core of an amorphous Fe-base alloy with a gap, the magnetic core should be integrally molded with a resin because the magnetic core is cut to provide a gap. However, since the amorphous Fe-base alloy has a large magnetostriction, the magnetic core suffers from an extremely increased core loss, and noises due to magnetostriction vibration may be generated. In the case of using the magnetic core made of an amorphous Fe-base alloy without a gap, resonance due to magnetostriction vibration may take place, making the operation of the choke coil unstable depending on frequencies, and also noises due to magnetostriction vibration may be generated.

Though the Fe dust core is inexpensive, it has a permeability as low as less than 100, suffering from a large core loss. In addition, a choke coil comprising the Fe dust core cannot be miniaturized so much. A choke coil using the dust magnetic core of an Fe—Al—Si alloy is superior in performance to the choke coil using the Fe dust core, but the dust magnetic core of an Fe—Al—Si alloy cannot be sufficiently miniaturized.

As described above, choke coils used in conventional active filter circuits have their own problems, and it has been desired to provide a high-performance choke coil which is suitable for a high-reliability, high-power factor active filter circuit, and a power supply apparatus with a high power factor including such an active filter circuit.

OBJECTS AND SUMMARY OF THE INVENTION

Accordingly, an object of the present invention is to provide an active filter circuit with a high reliability and a high power factor.

Another object of the present invention is to provide a power supply apparatus including such an active filter circuit.

As a result of intense research in view of the above objects, the inventors have found that a choke coil suitable for an active filter circuit can be composed of a magnetic core formed from a ribbon or powder and/or flake made of a nanocrystalline alloy and provided with a magnetic gap in at least one part thereof and at least one conductive wire wound around the magnetic core, because such a choke coil suffers from little temperature elevation and its magnetic core is not likely to be saturated by input current, whereby the active filter circuit including such a choke coil can be miniaturized and used in a high-speed switching operation. The present invention has been accomplished based on this finding.

In a first aspect of the present invention, there is provided an active filter circuit comprising a smoothing filter comprising a choke coil comprising a magnetic core made of a nanocrystalline alloy and having a magnetic gap in at least one portion thereof and at least one conductive wire wound around the magnetic core.

In a second aspect of the present invention, there is provided an active filter circuit comprising a smoothing filter comprising a choke coil comprising a magnetic core composed of nanocrystalline alloy powder and/or flake and an insulating material and at least one conductive wire wound around the magnetic core.

In a third aspect of the present invention, there is provided a power supply apparatus including such an active filter circuit in at least one part of an input circuit thereof.

BRIEF DESCRIPTION OF THE DRAWINGS

FIG. 4 (b) is a schematic view showing a wave form of voltage $V_{out}$ at a capacitor in the capacitor input-type rectifying circuit;

FIG. 4 (c) is a schematic view showing a wave form of current $I_{in}$ at the output terminal of an AC power supply in the capacitor input-type rectifying circuit;

DETAILED DESCRIPTION OF THE PREFERRED EMBODIMENTS

[1]Nanocrystalline alloy

Figure 1:
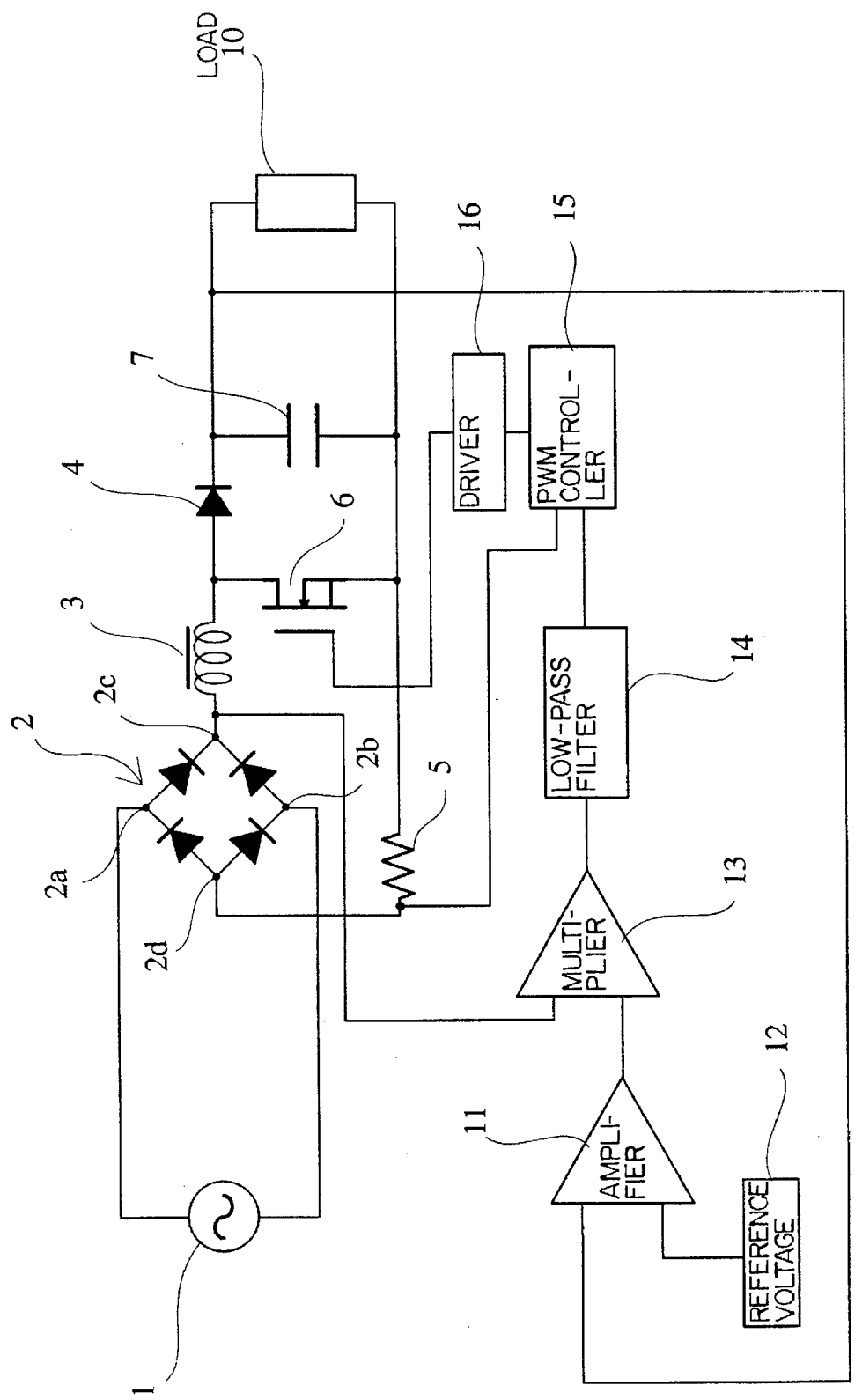
FIG. 1 is a schematic view showing an example of the active filter circuit according to the present invention.

The nanocrystalline alloys used for the choke coil of the active filter circuit of the present invention may be alloys disclosed in Japanese Patent Laid-Open No. 1-242755 and U. S. Pat. No. 4,881,989.

One specific example of the nanocrystalline alloys used in the present invention is an Fe-base alloy containing 0.1–3 atomic % of at least one element selected from the group consisting of Cu and Au, 1–7 atomic % of at least one element selected from the group consisting of Ti, Zr, Hf, V, Nb, Ta, Mo and W, 10–17 atomic % of Si, and 4–10 atomic % of B, the balance being substantially Fe and inevitable impurities, which can keep the temperature elevation low. More specifically, the preferred composition of this nanocrystalline alloy is 0.5–2 atomic % of at least one element selected from the group consisting of Cu and Au, 1.5–5 atomic % of at least one element selected from the group consisting of Ti, Zr, Hf, V, Nb, Ta, Mo and W, 10–15 atomic % of Si, and 6–9.5 atomic % of B, the balance being substantially Fe and inevitable impurities.

Another example of the nanocrystalline alloys used in the present invention is an Fe-base alloy containing 0–3 atomic % of at least one element selected from the group consisting of Cu and Au, 2–10 atomic % of at least one element selected from the group consisting of Ti, Zr, Hf, V, Nb, Ta, Mo and W, 0 to less than 10 atomic % of Si, and 2–10 atomic % of B, the balance being substantially Fe and inevitable impurities, which can exhibit sufficient effects as a choke coil even when a large input current flows. More specifically, the preferred composition of this nanocrystalline alloy is 0–2 atomic % of at least one element selected from the group consisting of Cu and Au, 5–8 atomic % of at least one element selected from the group consisting of Ti, Zr, Hf, V, Nb, Ta, Mo and W, 0–8 atomic % of Si, and 3–8 atomic % of B, the balance being substantially Fe and inevitable impurities.

In any case, at least 50% of the structure of the nanocrystalline alloy is occupied by ultrafine crystal grains having an average diameter of 100 nm or less, preferably 50 nm or less and more preferably 20 nm or less. The ultrafine crystal grains are mainly composed of a bcc-phase (body-centered cubic lattice phase) containing Fe as a main component and alloying elements such as Si, etc. as solid solution components. If the total amount of the ultrafine crystal grains having an average diameter of 100 nm or less is less than 50 volume %, sufficient characteristics cannot be obtained. The remaining portion of the nanocrystalline alloy may be constituted by an amorphous phase, though the nanocrystalline alloy may be 100% nanocrystalline.

The nanocrystalline alloy may be usually formed as a thin ribbon having a thickness from about 1 μm to about 40 μm. The preferred thickness of the thin ribbon is about 1 μm to about 25 μm when the core loss should particularly be reduced. The powder and/or flake of the nanocrystalline alloy may be produced by pulverizing such a thin ribbon.

The thin ribbon of the nanocrystalline alloy may be produced by forming a thin ribbon of an amorphous Fe-base alloy and heat-treating the resultant thin ribbon. Specifically, a thin ribbon of an amorphous alloy having a thickness of about 1 μm to about 40 μm is first formed by a rapid quenching method such as a single roll method, a double roll method, etc. The thin ribbon may partially include a crystalline phase such as bcc-phase, Fe—B compound phase, etc. After wound into a toroidal form, the thin ribbon is heat-treated at a temperature equal to or higher than the crystallization temperature, particularly 450°–700° C., more preferably 500°–600° C. for 5 minutes to 100 hours in an atmosphere of an inert gas such as an argon gas, a nitrogen gas, etc. or in the air. The term "crystallization temperature" used herein means a crystallization-initiating temperature which can be determined by observation of heat generation by crystallization at a heating rate of 10° C./min in a differential scanning calorimeter. By this heat treatment, at least 50 volume % of the alloy structure is occupied by ultrafine crystal grains having an average grain size of 100 nm or less. The heat-treated alloy may then be cooled preferably at 0.1° C./min or higher.

In the case of powder and/or flake, the thin ribbon of the nanocrystalline alloy is pulverized. The powder and/or flake of the nanocrystalline alloy may also be produced by an atomizing method. The alloy powder may have an average diameter of 0.1–100 μm, and the alloy flake may have an average diameter of 5–500 μm and an average thickness of 1–30 μm.

The nanocrystalline alloy preferably has a magnetostriction of substantially zero or slightly positive, specifically 0 to $+6 \times 10^{-6}$. When the magnetostriction of the nanocrystalline alloy is 0, the magnetic core shows a small core loss, resulting in minimum temperature elevation. When the magnetostriction of the nanocrystalline alloy is slightly positive, a decrease in inductance relative to current is small, making it possible to obtain a high power factor in a wide output range.

[2] Choke coil

The choke coil composed of the magnetic core of the nanocrystalline alloy shows only a small temperature elevation and is less likely to be saturated by input current, achieving a high-frequency switching when used in an active filter circuit. Accordingly, the active filter circuit occupies only small space.

In the case of the toroidal magnetic core, a thin ribbon of the nanocrystalline alloy is wound and solidified by an insulating material such as a heat-resistant resin. The preferred examples of such insulating materials are phenol resins, epoxy resins, acrylic resins, etc. The resin-solidified wound core is then cut radially in at least one portion thereof so that there is a magnetic gap of 0.1–5 mm in width. The magnetic gap may be filled with a spacer made of an insulating material. The magnetic core with a gap may be inserted into a non-magnetic casing before winding a coil of a conductive wire.

In the case of the so-called resin-bonded magnetic core made of nanocrystalline alloy powder and/or flake and an insulating material, the insulating material may be a heat-resistant organic or inorganic binder such as a heat-resistant inorganic varnish, etc. A coil of a conductive wire may be wound around the magnetic core with or without a non-magnetic casing.

[3] Active filter circuit

The active filter circuit of the present invention includes a smoothing filter composed of the above choke coil. Examples of the active filter circuit of the present invention are shown in FIGS. 1 and 2.

The active filter circuit shown in FIG. 1 comprises an AC power supply 1, a diode bridge 2 having two terminals 2a, 2b connected to the AC power supply 1, a choke coil 3 having an inductance L and connected to the terminal 2c of the diode bridge 2, a diode 4 connected to the choke coil 3, a resistor 5 connected to the terminal 2d of the diode bridge 2, a transistor 6 connected between the choke coil 3 and the resistor 5, and a capacitor 7 connected between the diode 4 and the resistor 5. Connected in parallel with the capacitor 7 is a switching power supply 10. The active filter circuit further comprises an amplifier 11 having one terminal connected to the output terminal of the diode 4 and the other terminal connected to a reference voltage 12. The output terminal of the amplifier 11 is connected to one input terminal of a multiplier 13, and the other input terminal of the multiplier 13 is connected between the diode bridge 2 and the choke coil 3. The output of the multiplier 13 is connected to a low-pass filter 14, which in turn is connected to a pulse width modulation (PWM) controller 15. The PWM controller 15 is also connected to the resistor 5 and to a gate of the transistor 6 via a driver 16.

Figure 2:
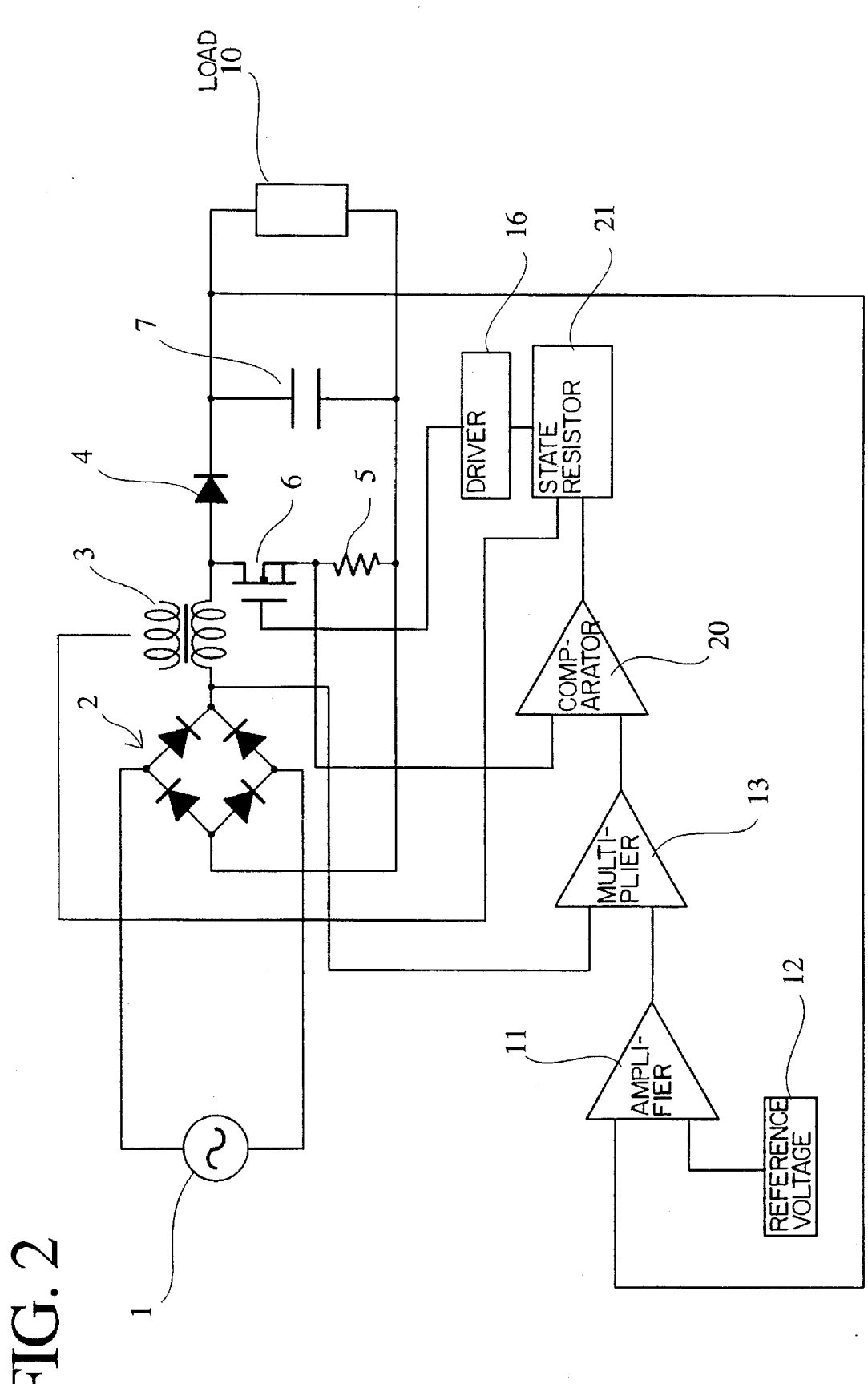
FIG. 2 is a schematic view showing another example of the active filter circuit according to the present invention.
Figure 3:
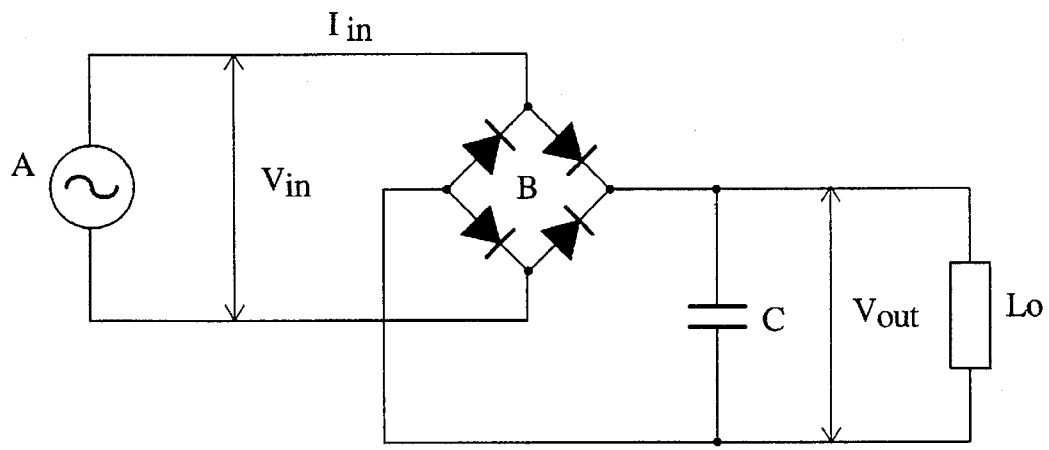
FIG. 3 is a schematic view showing an example of a capacitor input-type rectifying circuit.
Figure 5:
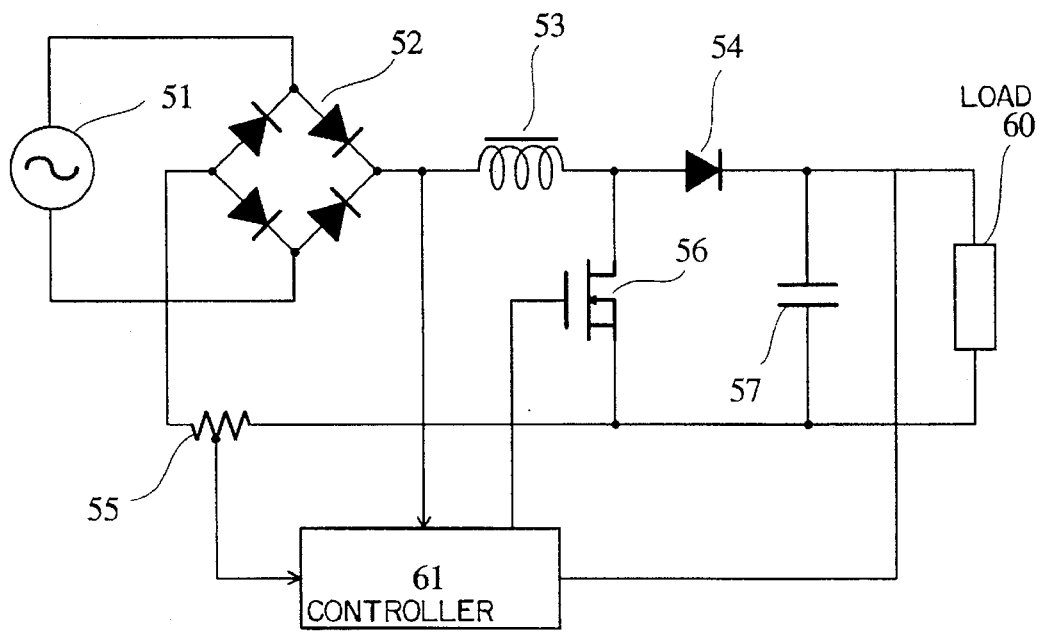
FIG. 5 is a schematic view showing an example of a boosting chopper-type active filter circuit.
Figure 4:
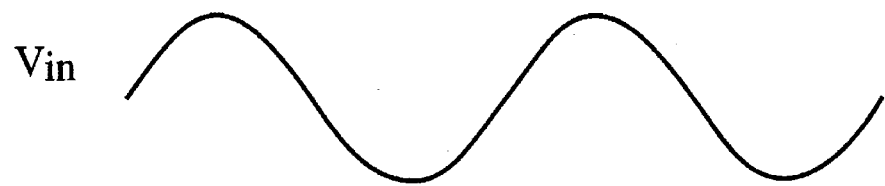
FIG. 4 (a) is a schematic view showing a wave form of voltage $V_{in}$ at the output terminal of an AC power supply in the capacitor input-type rectifying circuit.
Figure 4:
Figure 4:
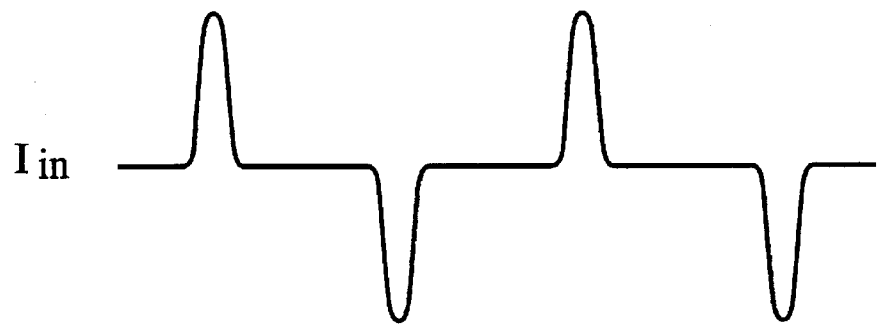

The active filter circuit shown in FIG. 2 has a similar structure to that of the circuit shown in FIG. 1. One feature of the active filter circuit shown in FIG. 2 is that it contains a comparator 20 having one input terminal connected to the multiplier 13 and the other input terminal connected between the transistor 6 and the resistor 5, and a state resistor 21 connected to the comparator 20, the choke coil 3 and a gate of the transistor 6 via a driver 16. Another feature of the active filter circuit shown in FIG. 2 is that the resistor 5 is series-connected to the transistor 6 and parallel-connected to the capacitor 7.

[3] Power supply apparatus

According to another aspect of the present invention, there is provided a power supply apparatus including the above active filter circuit in at least one part of an input circuit thereof. With this active filter circuit, the inductance parts and the capacitance parts may be miniaturized while keeping a high power factor. As a result, the power supply apparatus can be small and highly reliable. The power supply apparatus of the present invention generates smaller noises than the power supplies using choke coils made of amorphous Fe-base alloys.

The present invention will be further described referring to the following Examples without intention of restricting the scope of the present invention.

EXAMPLE 1, COMPARATIVE EXAMPLE 1

A thin alloy ribbon having a width of 12.5 mm and a thickness of 10 μm was produced by quenching a molten alloy consisting essentially of 1 atomic % of Cu, 2 atomic % of Nb, 15.5 atomic % of Si, 6.5 atomic % of B and balance Fe by a single roll method, and then wound into a toroidal core of 33 mm in outer diameter and 20 mm in inner diameter. The resultant toroidal core was subjected to a heat treatment at 550° C. for 1 hour in an argon gas atmosphere. The X-ray diffraction observation and transmission electron microscopy of the heat-treated alloy revealed that 50% or more of the alloy structure was an ultrafine bcc Fe phase, proving that the alloy was nanocrystalline. The nanocrystalline alloy also had as small a magnetostriction as less than $1 \times 10^{-6}$.

The toroidal core was impregnated with an epoxy resin in vacuum and then hardened in a theremostatic chamber. Next, the resin-molded toroidal core was cut at a part of a magnetic circuit thereof by a slicer, and the resultant gap was filled with a non-magnetic spacer to provide a 0.5-mm magnetic gap. The resultant magnetic core was inserted into a casing made of a phenol resin, and 50 turns of a conductive wire was wound around the casing to provide a choke coil having an inductance of 500 μH. With this choke coil as an inductance L, an active filter circuit shown in FIG. 1 was produced to measure a power factor and temperature elevation ΔT of the choke coil at an input voltage of 120 V, an output of 1 kW and a switching frequency of 100 kHz. The results are shown in Table 1.

For comparison, in the case of using a choke coil composed of an Fe dust core in the circuit of FIG. 1, the temperature elevation ΔT of the choke coil, the power factor and size of the magnetic core are also shown in Table 1.

TABLE 1

| No. | Magnetic Core | | ΔT (°C.) | Power Factor |
|---|---|---|---|---|
| | Material | Size[1] | | |
| Example 1 | Nanocrystalline[2] | 33 × 20 × 12.5 | 35 | 0.998 |
| Com. Ex. 1 | Fe Dust Core[3] | 45 × 20 × 20 | 45 | 0.991 |

Note:
[1] Outer diameter × inner diameter × height.
[2] $Fe_{bal}Cu_1Nb_2Si_{15.5}B_{6.5}$.
[3] Made of electrolytic iron (pure iron).

As is clear from Table 1, the choke coil for an active filter circuit of the present invention (Example 1) is smaller in size and temperature elevation than the conventional choke coil (Comparative Example 1), realizing an active filter circuit having a higher power factor than the latter.

EXAMPLES 2–16, COMPARATIVE EXAMPLES 2–4

Toroidal magnetic cores of nanocrystalline alloys were produced from alloys shown in Table 2 in the same manner as in Example 1, and dust magnetic cores of nanocrystalline alloys were produced by blending pulverized nanocrystalline alloys shown in Table 2 with 7 weight % of a heat-resistant inorganic varnish as a binder and pressing the resultant blends at 400° C. Each magnetic core was heat-treated at 550° C. for 1 hour. Each magnetic core had a size of 35 mm in outer diameter, 20 mm in inner diameter and 12.5 mm in height.

The X-ray diffraction observation and transmission electron microscopy of each alloy in the heat-treated magnetic core revealed that 50% or more of the alloy structure was an ultrafine bcc Fe phase, proving that the alloy was nanocrystalline.

A conductive wire was wound around each magnetic core to provide a choke coil for an active filter circuit. The choke coil was then incorporated as an inductance L into an active filter circuit shown in FIG. 2 to measure power factor and temperature elevation ΔT of the choke coil at an input voltage of 120 V, an output of 1 kW and a switching frequency of 100 kHz. The results are shown in Table 2.

TABLE 2

| No. | Alloy Composition (atomic %) | Form | ΔT (°C.) | Power Factor |
|---|---|---|---|---|
| Example | | | | |
| 2 | $Fe_{bal.}Cu_1Nb_2Si_{11}B_9$ | With Gap | 35 | 0.996 |
| 3 | $Fe_{bal.}Cu_1Ta_2Si_{11}B_9$ | Dust Core | 36 | 0.995 |
| 4 | $Fe_{bal.}Cu_1Hf_2Si_{10}B_9$ | With Gap | 37 | 0.995 |
| 5 | $Fe_{bal.}Cu_1Zr_5B_9$ | With Gap | 35 | 0.996 |
| 6 | $Fe_{bal.}Cu_1Hf_7B_5$ | Dust Core | 38 | 0.996 |
| 7 | $Fe_{bal.}Cu_1Zr_2Si_8B_9$ | With Gap | 35 | 0.994 |
| 8 | $Fe_{bal.}Cu_1Zr_8W_1B_2$ | Dust Core | 36 | 0.995 |
| 9 | $Fe_{bal.}Cu_1Nb_3Si_{13}B_7$ | Dust Core | 34 | 0.996 |
| 10 | $Fe_{bal.}Cu_1Nb_2Si_{17}B_6$ | With Gap | 37 | 0.996 |
| 11 | $Fe_{bal.}Au_1Nb_2V_1Si_{10}B_9$ | With Gap | 38 | 0.994 |
| 12 | $Fe_{bal.}Cu_1Mo_3Si_{16}B_{6.5}$ | With Gap | 38 | 0.994 |
| 13 | $Fe_{bal.}Cu_1Nb_5Si_{13}B_9$ | Dust Core | 36 | 0.996 |
| 14 | $Fe_{bal.}Zr_7B_3$ | With Gap | 39 | 0.996 |
| 15 | $Fe_{bal.}Cu_1Nb_3Si_{17}B_3$ | With Gap | 41 | 0.994 |
| 16 | $Fe_{bal.}Cu_{0.6}Zr_7Si_{11}B_6$ | With Gap | 40 | 0.994 |
| Comparative Example | | | | |
| 2 | Amorphous Fe-base alloy[1] | With Gap | 43 | 0.992 |
| 3 | Silicon-steel | With Gap | 53 | 0.990 |
| 4 | Fe—Al—Si[2] | Dust Core | 43 | 0.992 |

Note:
[1]$Fe_{bal.}Si_9B_{13}$.
[2]$Fe_{bal.}Al_{10}Si_5$ (weight %).

As is clear from Table 2, the choke coil of the present invention suffers from only small temperature elevation and can be miniaturized with a high power factor. Accordingly, a power supply apparatus including the active filter circuit of the present invention can be drastically miniaturized with excellent performance.

EXAMPLES 17–19, COMPARATIVE EXAMPLES 5–7

Figure 6:
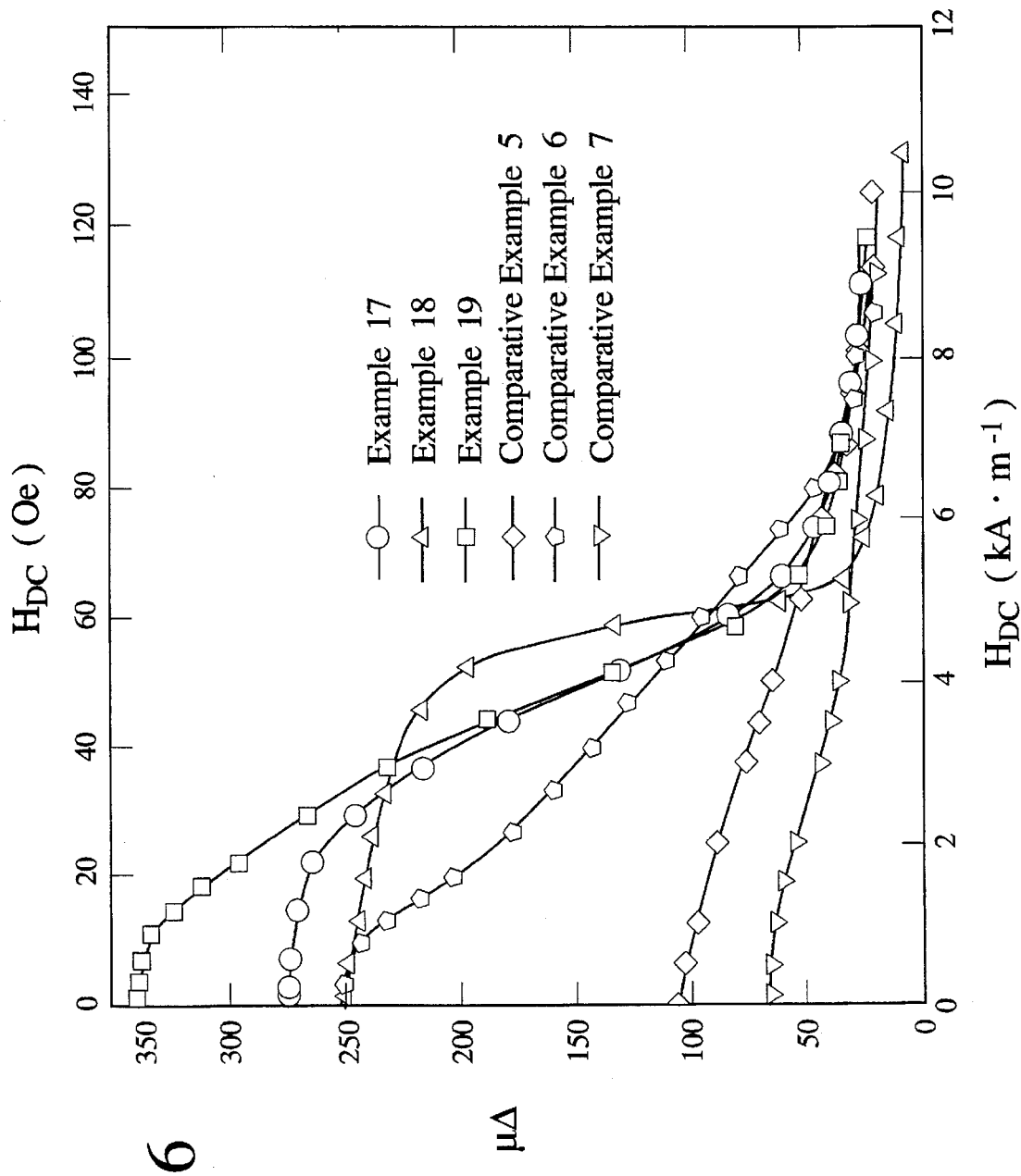
FIG. 6 is a graph showing the DC superposition characteristics of the choke coils of the present invention and conventional choke coils at 100 kHz.

Choke coils produced by using alloys shown in Table 3 according to the present invention and conventional choke coils for active filter circuits were measured with respect to DC superposition characteristics at 100 kHz. The results are shown in FIG. 6.

Table 3 also shows core losses Pc at a frequency of 100 kHz, and Bm of 0.1 T when a magnetic field of 5 Oe was applied to the magnetic cores.

TABLE 3

| No. | Alloy Composition (atomic %) | Core Loss Pc (kW · m$^{-3}$) |
|---|---|---|
| Example | | |
| 17 | $Fe_{bal.}Cu_1Nb_2Si_{10}B_9$ | 480 |
| 18 | $Fe_{bal.}Cu_1Nb_2Si_{16}B_7$ | 370 |
| 19 | $Fe_{bal.}Cu_1Zr_7Si_1B_6$ | 530 |
| Comparative Example | | |
| 5 | Fe—Al—Si dust core[1] | 1600 |
| 6 | Amorphous Fe-base alloy[2] | 650 |
| 7 | Fe dust core[3] | 5500 |

Note:
[1]$Fe_{bal.}Al_{10}Si_5$ (weight %).
[2]$Fe_{bal.}Si_9B_{13}$.
[3]Electrolytic iron (pure iron).

As is clear from Table 3, since the choke coil of the present invention shows a small core loss Pc when a DC magnetic field is superimposed, it can suppress the temperature elevation with a high efficiency when used in an active filter circuit.

Table 4 shows noises of an active filter circuit including the choke coil of the present invention and an active filter circuit including a conventional choke coil of an amorphous Fe-base alloy. It is clear from Table 4 that the choke coil of the present invention generates smaller noises than the conventional choke coil of an amorphous Fe-base alloy.

TABLE 4

| No. | Material of Choke Coil | Noises |
|---|---|---|
| Example 17 | Nanocrystalline $Fe_{bal.}Cu_1Nb_2Si_{10}B_9$ | 32 dB |
| Com. Ex. 6 | Amorphous Fe-base alloy | 41 dB |

As described in detail above, by using a choke coil suffering from only a small temperature elevation with small noises in an active filter circuit, the active filter circuit can be miniaturized. Also, a power supply apparatus including such an active filter circuit is small with a high power factor.

What is claimed is:

1. A boosting chopper-type active filter circuit comprising a smoothing filter comprising a choke coil comprising a toroidal magnetic core made of a nanocrystalline alloy and having a magnetic gap in at least one portion thereof and at least one conductive wire wound around said toroidal magnetic core.

2. A boosting chopper-type active filter circuit comprising a smoothing filter comprising a choke coil comprising a magnetic core composed of an insulating material and at least one of a nanocrystalline alloy powder and a nanocrystalline flake, and at least one conductive wire wound around said magnetic core.

3. The boosting chopper-type active filter circuit according to claim 1, wherein said nanocrystalline alloy is an Fe-base alloy comprising 0.1–3 atomic % of at least one element selected from the group consisting of Cu and Au, 1–7 atomic % of at least one element selected from the group consisting of Ti, Zr, Hf, V, Nb, Ta, Mo and W, 10–17 atomic % of Si, and 4–10 atomic % of B, the balance being substantially Fe and inevitable impurities.

4. The boosting chopper-type active filter circuit according to claim 2, wherein said nanocrystalline alloy is an Fe-base alloy comprising 0.1–3 atomic % of at least one element selected from the group consisting of Cu and Au, 1–7 atomic % of at least one element selected from the group consisting of Ti, Zr, Hf, V, Nb, Ta, Mo and W, 10–17 atomic % of Si, and 4–10 atomic % of B, the balance being substantially Fe and inevitable impurities.

5. The boosting chopper-type active filter circuit according to claim 1, wherein said nanocrystalline alloy is an Fe-base alloy comprising 0–3 atomic % of at least one element selected from the group consisting of Cu and Au, 2–10 atomic % of at least one element selected from the group consisting of Ti, Zr, Hf, V, Nb, Ta, Mo and W, 0 to less than 10 atomic % of Si, and 2–10 atomic % of B, the balance being substantially Fe and inevitable impurities.

6. The boosting chopper-type active filter circuit according to claim 2, wherein said nanocrystalline alloy is an Fe-base alloy comprising 0–3 atomic % of at least one element selected from the group consisting of Cu and Au, 2–10 atomic % of at least one element selected from the group consisting of Ti, Zr, Hf, V, Nb, Ta, Mo and W, 0 to less than 10 atomic % of Si, and 2–10 atomic % of B, the balance being substantially Fe and inevitable impurities.

7. The boosting chopper-type active filter circuit according to claim 2, wherein said insulating material is a heat-resistant organic or inorganic binder.

8. A power supply apparatus comprising an input circuit having a boosting chopper-type active filter circuit comprising a smoothing filter comprising a choke coil comprising a toroidal magnetic core made of a nanocrystalline alloy and having a magnetic gap in at least one portion thereof and at least one conductive wire wound around said toroidal magnetic core.

9. A power supply apparatus comprising an input circuit having a boosting chopper-type active filter circuit comprising a smoothing filter comprising a choke coil comprising a magnetic core composed of an insulating material and at least one of a nanocrystalline alloy powder and a nanocrystalline alloy flake and at least one conductive wire wound around said magnetic core.

10. A power supply apparatus according to claim 8, wherein said nanocrystalline alloy is an Fe-base alloy comprising 0.1–3 atomic % of at least one element selected from the group consisting of Cu and Au, 1–7 atomic % of at least one element selected from the group consisting of Ti, Zr, Hf, V, Nb, Ta, Mo and W, 10–17 atomic % of Si, and 4–10 atomic % of B, the balance being substantially Fe and inevitable impurities.

11. A power supply apparatus according to claim 9, wherein said nanocrystalline alloy is an Fe-base alloy comprising 0.1–3 atomic % of at least one element selected from the group consisting of Cu and Au, 1–7 atomic % of at least one element selected from the group consisting of Ti, Zr, Hf, V, Nb, Ta, Mo and W, 10–17 atomic % of Si, and 4–10 atomic % of B, the balance being substantially Fe and inevitable impurities.

12. A power supply apparatus according to claim 8, wherein said nanocrystalline alloy is an Fe-base alloy comprising 0–3 atomic % of at least one element selected from the group consisting of Cu and Au, 2–10 atomic % of at least one element selected from the group consisting of Ti, Zr, Hf, V, Nb, Ta, Mo and W, 0 to less than 10 atomic % of Si, and 2–10 atomic % of B, the balance being substantially Fe and inevitable impurities.

13. A power supply apparatus according to claim 9, wherein said nanocrystalline alloy is an Fe-base alloy comprising 0–3 atomic % of at least one element selected from the group consisting of Cu and Au, 2–10 atomic % of at least one element selected from the group consisting of Ti, Zr, Hf, V, Nb, Ta, Mo and W, 0 to less than 10 atomic % of Si, and 2–10 atomic % of B, the balance being substantially Fe and inevitable impurities.

\* \* \* \* \*